(12) United States Patent
Dix et al.

(10) Patent No.: US 9,337,253 B2
(45) Date of Patent: *May 10, 2016

(54) METHOD AND APPARATUS FOR CONSTRUCTING AN ISOLATION CAPACITOR IN AN INTEGRATED CIRCUIT

(71) Applicant: Microchip Technology Incorporated, Chandler, AZ (US)

(72) Inventors: Gregory Dix, Tempe, AZ (US); Randy Yach, Phoenix, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/199,522

(22) Filed: Mar. 6, 2014

(65) Prior Publication Data

US 2014/0252551 A1    Sep. 11, 2014

Related U.S. Application Data

(60) Provisional application No. 61/775,550, filed on Mar. 9, 2013.

(51) Int. Cl.
*H01L 21/02* (2006.01)
*H01L 49/02* (2006.01)
(Continued)

(52) U.S. Cl.
CPC .................. *H01L 28/40* (2013.01); *H01G 4/40* (2013.01); *H01L 23/642* (2013.01); *H01G 4/06* (2013.01); *H01L 24/05* (2013.01); *H01L 24/06* (2013.01); *H01L 24/48* (2013.01); *H01L 24/49* (2013.01); *H01L 2224/02166* (2013.01); *H01L 2224/04042* (2013.01); *H01L 2224/05554* (2013.01); *H01L 2224/05567* (2013.01); *H01L 2224/0603* (2013.01); *H01L 2224/06135* (2013.01); *H01L 2224/48091* (2013.01);
(Continued)

(58) Field of Classification Search
CPC ....... H01L 28/40; H01L 23/642; H01L 24/05; H01L 24/06; H01L 24/48; H01L 24/49
USPC ........................................................ 257/532
See application file for complete search history.

(56) References Cited

U.S. PATENT DOCUMENTS 5,444,600 A * 8/1995 Dobkin et al. ................ 361/303
6,442,213 B1   8/2002 Krone et al. .................. 375/285
(Continued)

FOREIGN PATENT DOCUMENTS

| DE | 10234999 A1 | 2/2004 | ............. H02M 3/00 |
| WO | 98/44560 A1 | 10/1998 | ............. H01L 27/04 |
| WO | 2012/068198 A1 | 5/2012 | ............ H01L 23/482 |

OTHER PUBLICATIONS

International Search Report and Written Opinion, Application No. PCT/US2014/021540, 10 pages, Jun. 18, 2014.
International Search Report and Written Opinion, Application No. PCT/US2014/021614, 10 pages, Jun. 25, 2014.
(Continued)

*Primary Examiner* — Nicholas Tobergte
(74) *Attorney, Agent, or Firm* — Slayden Grubert Beard PLLC

(57) ABSTRACT

At least one high voltage rated isolation capacitor is formed on a face of a primary integrated circuit die. The isolation capacitor AC couples the primary integrated circuit in a first voltage domain to a second integrated circuit in a second voltage domain. The isolation capacitor DC isolates the primary integrated circuit from the second integrated circuit die.

17 Claims, 9 Drawing Sheets

(51) Int. Cl.
*H01L 23/64* (2006.01)
*H01G 4/40* (2006.01)
*H01G 4/06* (2006.01)
*H03K 17/689* (2006.01)
*H01L 23/00* (2006.01)
*H04L 25/02* (2006.01)

(52) U.S. Cl.
CPC ............... *H01L 2224/48111* (2013.01); *H01L 2224/48137* (2013.01); *H01L 2224/48195* (2013.01); *H01L 2224/48247* (2013.01); *H01L 2224/48265* (2013.01); *H01L 2224/49175* (2013.01); *H01L 2924/00014* (2013.01); *H01L 2924/10253* (2013.01); *H01L 2924/14* (2013.01); *H01L 2924/19041* (2013.01); *H01L 2924/19104* (2013.01); *H01L 2924/19107* (2013.01); *H01L 2924/3011* (2013.01); *H03K 17/689* (2013.01); *H04L 25/0266* (2013.01)

(56) References Cited

U.S. PATENT DOCUMENTS

| | | | |
|---|---|---|---|
| 6,611,051 | B2 | 8/2003 | Akiyama et al. ............. 257/685 |
| 7,737,871 | B2 | 6/2010 | Leung et al. ................. 341/100 |
| 7,864,546 | B2 | 1/2011 | Dhuyvetter et al. ............ 363/17 |
| 8,564,978 | B2 | 10/2013 | Keller ........................ 363/21.07 |
| 8,680,690 | B1* | 3/2014 | Steeneken et al. ............ 257/784 |
| 8,988,142 | B2* | 3/2015 | Yach et al. .................... 327/540 |
| 2002/0135236 | A1* | 9/2002 | Haigh et al. .................... 307/91 |
| 2003/0071322 | A1* | 4/2003 | Comeau et al. ............... 257/500 |
| 2004/0029404 | A1* | 2/2004 | Lin ................................ 438/958 |
| 2006/0290377 | A1 | 12/2006 | Kim et al. ....................... 326/30 |
| 2008/0290444 | A1* | 11/2008 | Crawley et al. ............... 257/503 |
| 2009/0206960 | A1 | 8/2009 | Ng et al. ........................ 333/247 |
| 2012/0068306 | A1 | 3/2012 | Song et al. .................... 257/532 |

OTHER PUBLICATIONS

International Search Report and Written Opinion, Application No. PCT/US2014/022640, 14 pages, Jul. 28, 2014.

\* cited by examiner

| Capacitor (pF) | Voltage (V) | Frequency (MHz) | Current (mA) |
|---|---|---|---|
| 10 | 5 | 0 | 0.0 |
| 10 | 5 | 10 | 3.2 |
| 10 | 5 | 20 | 6.3 |
| 10 | 5 | 30 | 9.5 |
| 10 | 5 | 40 | 12.6 |
| 10 | 5 | 50 | 15.7 |
| 10 | 5 | 60 | 18.9 |
| 10 | 5 | 70 | 22.0 |
| 10 | 5 | 80 | 25.2 |
| 10 | 5 | 90 | 28.3 |
| 10 | 5 | 100 | 31.4 |
| 10 | 5 | 110 | 34.6 |
| 10 | 5 | 120 | 37.7 |
| 10 | 5 | 130 | 40.9 |
| 10 | 5 | 140 | 44.0 |
| 10 | 5 | 150 | 47.2 |
| 10 | 5 | 160 | 50.3 |
| 10 | 5 | 170 | 53.4 |
| 10 | 5 | 180 | 56.6 |
| 10 | 5 | 190 | 59.7 |
| 10 | 5 | 200 | 62.9 |

$$i = C\frac{dV}{dt} = 2\pi f V C$$

METHOD AND APPARATUS FOR CONSTRUCTING AN ISOLATION CAPACITOR IN AN INTEGRATED CIRCUIT

RELATED PATENT APPLICATION

This application claims priority to commonly owned U.S. Provisional Patent Application Ser. No. 61/775,550; filed Mar. 9, 2013; which is hereby incorporated by reference herein for all purposes.

TECHNICAL FIELD

The present disclosure relates to high voltage isolation capacitors, in particular to a method and apparatus for constructing high voltage isolation capacitors in an integrated circuit.

BACKGROUND

In recent industrial applications, the need for electrical isolation, both Galvanic and direct current (DC)-to-DC, is increasing for both data communication and DC supply voltages, e.g., at differing ground potentials. The typical isolation application has been mainly for data communications across an isolation barrier. But in recent years, applications are demanding that the isolation device (for data communication) also include isolated DC-to-DC energy transfer capabilities as well.

Typical electrical isolation methods may include: optical, inductive, e.g., using alternating current (AC) through a transformer or electromagnetic radio frequencies, capacitor (capacitor is a very good galvanic isolator), etc. Optical couplers have been the dominant signal isolation device but are limited to slow data rates (less than 1 MHz) and are bulky to integrate. Moreover, the optical coupler is not capable of passing isolated DC power. Inductive and capacitive isolation implementations provide for high data rates, offer electrically isolated power transfer, and are low-cost to manufacture. However integrating effective high voltage isolation capacitors in an integrated circuit package has been problematic.

SUMMARY

Therefore, a need exists for a way to fabricate high voltage isolation capacitors in a monolithic integrated circuit process, e.g., for isolation of both power transfer and signaling purposes.

According to an embodiment, a method for forming a high voltage rated isolation capacitor may comprise the steps of: providing a semiconductor integrated circuit; depositing on at least a portion of a face of the semiconductor integrated circuit an insulating layer; depositing a first electrically conductive layer on the insulating layer; depositing a high voltage rated dielectric layer on the first electrically conductive layer; depositing a second electrically conductive layer on the high voltage rated dielectric layer; and patterning the high voltage rated dielectric layer and the second electrically conductive layer to cover an area of the first electrically conductive layer for forming the high voltage rated isolation capacitor, wherein at least one exposed portion of the first electrically conductive layer provides for at least one first electrical connection thereto.

According to a further embodiment of the method, may comprise the steps of patterning the first electrically conductive layer into a first plate for the high voltage rated isolation capacitor, and patterning the second electrically conductive layer into a second plate for the high voltage rated isolation capacitor. According to a further embodiment of the method, may comprise the steps of patterning the first electrically conductive layer into a plurality of first plates for a plurality of high voltage rated isolation capacitors, and patterning the second electrically conductive layer into a plurality of second plates for the plurality of high voltage rated isolation capacitors. According to a further embodiment of the method, may comprise the step of passivating over the first and second electrically conductive layers, wherein the passivation covers the second electrically conductive layer and provides openings for the at least one first electrical connection and at least one second electrical connection to the second electrically conductive layer.

According to a further embodiment of the method, the semiconductor integrated circuit may be a scrap integrated circuit die. According to a further embodiment of the method, the first and second electrically conductive layers may be metal. According to a further embodiment of the method, the first and second electrically conductive metal layers may be comprised of aluminum According to a further embodiment of the method, the first and second electrically conductive layers may be comprised of copper. According to a further embodiment of the method, the first and second electrically conductive layers may be selected from any one or more of the group consisting of titanium, tantalum, cobalt, molybdenum, and silicides and salicides thereof.

According to a further embodiment of the method, the high voltage rated dielectric layer thickness may be determined by a voltage withstand requirement. According to a further embodiment of the method, the high voltage rated dielectric layer may comprise silicon dioxide ($SiO_2$). According to a further embodiment of the method, the high voltage rated dielectric layer may comprise silicon nitride (SiN). According to a further embodiment of the method, the high voltage rated dielectric layer may comprise Oxynitride. According to a further embodiment of the method, the high voltage rated dielectric layer may comprise stacked layers of doped or undoped oxides of different thicknesses and deposited or grown by standard techniques. According to a further embodiment of the method, the high voltage rated dielectric layer may have a thickness of about four (4) microns ($\mu$). According to a further embodiment of the method, the high voltage rated isolation capacitor may have a capacitance value of about 10 picofards.

According to another embodiment, a method for forming a high voltage rated isolation capacitor may comprise the steps of: providing a semiconductor integrated circuit; depositing on at least a portion of a face of the semiconductor integrated circuit an insulating layer; depositing a first electrically conductive layer on the insulating layer; depositing a high voltage rated dielectric layer on the first electrically conductive layer; patterning the high voltage rated dielectric layer to cover an area of the first electrically conductive layer and provide at least one opening thereto; depositing a conductive material into the at least one opening for forming at least one first electrical connection to the first electrically conductive layer; depositing a second electrically conductive layer on the high voltage rated dielectric layer; and patterning the second electrically conductive layer to cover an area of the first electrically conductive layer for forming the high voltage rated isolation capacitor.

According to a further embodiment of the method, may comprise the steps of patterning the first electrically conductive layer into a first plate for the high voltage rated isolation capacitor, and patterning the second electrically conductive layer into a second plate for the high voltage rated isolation capacitor. According to a further embodiment of the method, may comprise the steps of patterning the first electrically conductive layer into a plurality of first plates for a plurality of high voltage rated isolation capacitors, and patterning the second electrically conductive layer into a plurality of second plates for the plurality of high voltage rated isolation capacitors. According to a further embodiment of the method, may comprise the step of passivating over the first and second electrically conductive layers, wherein the passivation covers the second electrically conductive layer and provides openings for the at least one first electrical connection and at least one second electrical connection to the second electrically conductive layer.

According to yet another embodiment, an integrated circuit device adapted to have voltage isolation between different voltage domains may comprise: a primary integrated circuit; a first insulating layer on at least a portion of a face of the primary integrated circuit; a first electrically conductive layer on the first insulating layer, wherein the first electrically conductive layer may be coupled to a circuit connection pad on the primary integrated circuit; a high voltage rated dielectric layer on a portion of the first electrically conductive layer; and a second electrically conductive layer on the high voltage rated dielectric layer, wherein the first and second electrically conductive layers and the high voltage rated dielectric layer form a high voltage rated isolation capacitor.

According to a further embodiment, a secondary integrated circuit may be provided having a circuit connection pad coupled to the second electrically conductive layer, wherein the primary integrated circuit may be in a first voltage domain and the secondary integrated circuit may be in a second voltage domain. According to a further embodiment, a second insulating layer may be provided over at least a portion of the second electrically conductive layer, and over portions of the high voltage rated dielectric layer and the first electrically conductive layer, wherein the second insulating layer may have a first opening over the first electrically conductive layer for a first bond wire to couple the first electrically conductive layer to the circuit connection pad on the primary integrated circuit, and a second opening over the second electrically conductive layer for a second bond wire to couple the second electrically conductive layer to the circuit connection pad on the secondary integrated circuit.

According to a further embodiment, an integrated circuit package may be provided for encapsulating the primary and secondary integrated circuits and the high voltage rated isolation capacitor. According to a further embodiment, the first and second electrically conductive layers may be metal. According to a further embodiment, the first and second electrically conductive metal layers may be comprised of aluminum. According to a further embodiment, the first and second electrically conductive layers may be comprised of copper According to a further embodiment, the first and second electrically conductive layers may be selected from any one or more of the group consisting of titanium, tantalum, cobalt, molybdenum, and silicides and salicides thereof.

According to a further embodiment, the high voltage rated dielectric layer may comprise silicon dioxide ($SiO_2$). According to a further embodiment, the high voltage rated dielectric layer may comprise silicon nitride (SiN). According to a further embodiment, the high voltage rated dielectric layer may comprise Oxynitride. According to a further embodiment, the high voltage rated dielectric layer may comprise stacked layers of doped or undoped oxides of different thicknesses and deposited or grown by standard techniques. According to a further embodiment, the high voltage rated dielectric layer may have a thickness of about four (4) microns (μ According to a further embodiment, the high voltage rated isolation capacitor may have a capacitance value of about 10 picofards. According to a further embodiment, the primary integrated circuit may be a microcontroller.

According to still another embodiment, an integrated circuit device adapted to have voltage isolation between different voltage domains may comprise: a primary integrated circuit; a first insulating layer over at least a portion of a face of the primary integrated circuit; a plurality of first high voltage rated isolation capacitors over the first insulating layer, wherein each of the plurality of first high voltage rated isolation capacitors may comprise a first electrically conductive layer on the first insulating layer, wherein some of the first electrically conductive layers may be coupled to respective circuit connection pads on the primary integrated circuit; a first high voltage rated dielectric layer on a portion of a respective one of the plurality of first electrically conductive layers; and a second electrically conductive layer on the respective high voltage rated dielectric layer.

According to a further embodiment, a second integrated circuit may be provided having circuit connection pads coupled to respective second electrically conductive layers, wherein the primary integrated circuit may be in a first voltage domain and the second integrated circuit may be in a second voltage domain. According to a further embodiment, an integrated circuit package may be provided for encapsulating the primary integrated circuit and the first high voltage rated isolation capacitors. According to a further embodiment, the integrated circuit package may have some external connection nodes coupled to respective first electrically conductive layers and some other external connection nodes coupled to respective second electrically conductive layers of the plurality of first high voltage rated isolation capacitors. According to a further embodiment, the external connection nodes may be lead fingers of the integrated circuit package lead frame and the respective lead fingers may be coupled to the first and second electrically conductive layers with bond wires.

According to a further embodiment, the integrated circuit device may comprise a second insulating layer over at least a portion of the second electrically conductive layers; a plurality of second high voltage rated isolation capacitors over the second insulating layer, wherein each of the plurality of second high voltage rated isolation capacitors may comprise a third electrically conductive layer on the second insulating layer, wherein some of the third electrically conductive layers may be coupled to respective circuit connection pads on a third integrated circuit; a second high voltage rated dielectric layer on a portion of a respective one of the plurality of third electrically conductive layers; and a fourth electrically conductive layer on the respective second high voltage rated dielectric layer, wherein some of the fourth electrically conductive layers may be coupled to respective circuit connection pads on the primary integrated circuit die.

According to a further embodiment, an integrated circuit package may be provided for encapsulating the primary and second integrated circuit, and the first high voltage rated isolation capacitors According to a further embodiment, an integrated circuit package may be provided for encapsulating the primary, second and third integrated circuit, and the first and second high voltage rated isolation capacitors. According to a further embodiment, the third integrated circuit may be in a third voltage domain. According to a further embodiment, the integrated circuit package may have some external connection nodes coupled to respective fourth electrically conductive layers and some other external connection nodes coupled to respective third electrically conductive layers of the plurality of second high voltage rated isolation capacitors. According to a further embodiment, the external connection nodes may be lead fingers of the integrated circuit package lead frame and the respective lead fingers may be coupled to the first and second electrically conductive layers with bond wires.

BRIEF DESCRIPTION OF THE DRAWINGS

A more complete understanding of the present disclosure may be acquired by referring to the following description taken in conjunction with the accompanying drawings wherein:

FIGS. 7 and 7A illustrate schematic elevational view diagrams of a plurality of inverse stacked high voltage rated isolation capacitors formed on an integrated circuit, according to another specific example embodiment of this disclosure.

Figure 1:
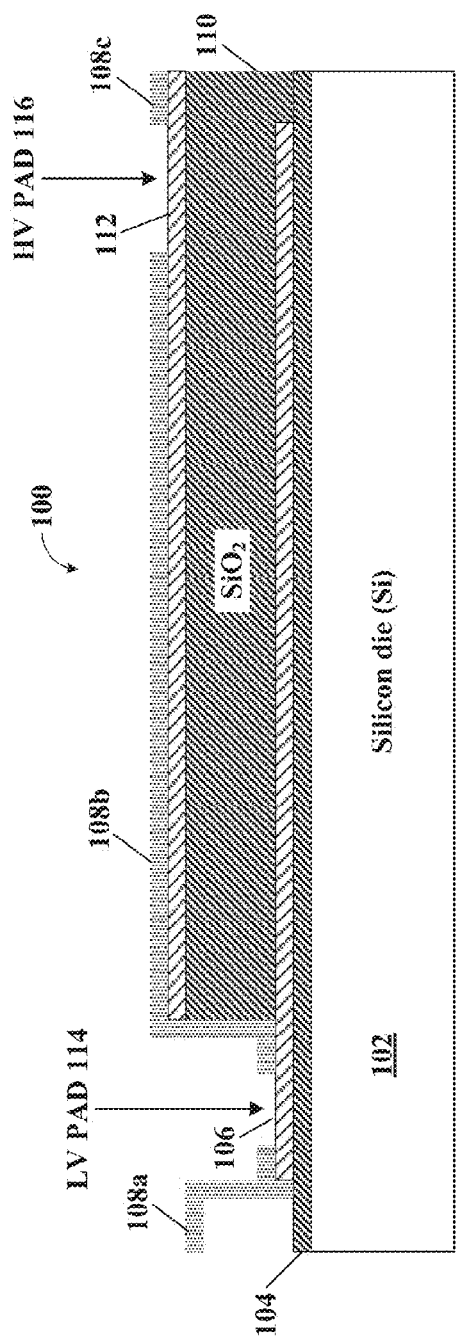
FIGS. 1 and 1A illustrate schematic elevational view diagrams of a high voltage rated isolation capacitor formed on an integrated circuit, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

According to various embodiments, a method and apparatus may be provided for constructing high voltage rated isolation capacitors on an integrated circuit die. According to various embodiments, a method of creating low-cost high voltage rated capacitors are disclosed herein. A unique method of forming a high-voltage rated capacitor with special electrode geometry and low cost $SiO_2$ dielectric material is disclosed herein that facilitate making low-cost $SiO_2$ based dielectric insulated high-voltage rated capacitors that require only a small area above integrated circuit silicon that may have active circuits thereunder.

An isolated supply voltage may be generated, which is electrically isolated from the primary supply source. Such a feature can become very demanding for modern electronic system design. DC-to-DC isolation and AC-to-DC isolation are examples thereof. A capacitive isolation device may use (a) a method of transferring power from the primary to the secondary side across a capacitive isolation barrier; and (b) a method of regulating the isolated secondary power using a feedback network. For such an application a high voltage rating (>3000 Vrms) silicon capacitors are needed to create an electrical, e.g., Galvanic, isolation barrier between different communication devices. This high voltage rated capacitor may be used for (a) isolated DC-to-DC power transfer and (b) isolated data communication between devices connected to different voltage domains.

According to various embodiments, for example, scrap integrated circuit wafers may be used with simple processing to make the isolation capacitors described herein based on silicon dioxide ($SiO_2$) and aluminum that are suitable to use in a stacked integrated circuit package. The electrically insulating oxide thickness may be selected to withstand several thousand volts and the resulting capacitance high enough to enable efficient power and signal transfer between integrated circuit devices connected to two different voltage domains.

Using stacked die $SiO_2$ insulated capacitors was thought to yield too low of a value of capacitance. However, according to various embodiments of this disclosure, by using various circuit techniques, e.g., higher voltage transistors, voltage doublers and triplers, etc., for providing a higher voltage across these capacitors, they may be fabricated with sufficient capacitance for efficient power and signal transfer.

Referring now to the drawings, the details of example embodiments are schematically illustrated. Like elements in the drawings will be represented by like numbers, and similar elements will be represented by like numbers with a different lower case letter suffix.

Figure 1A:
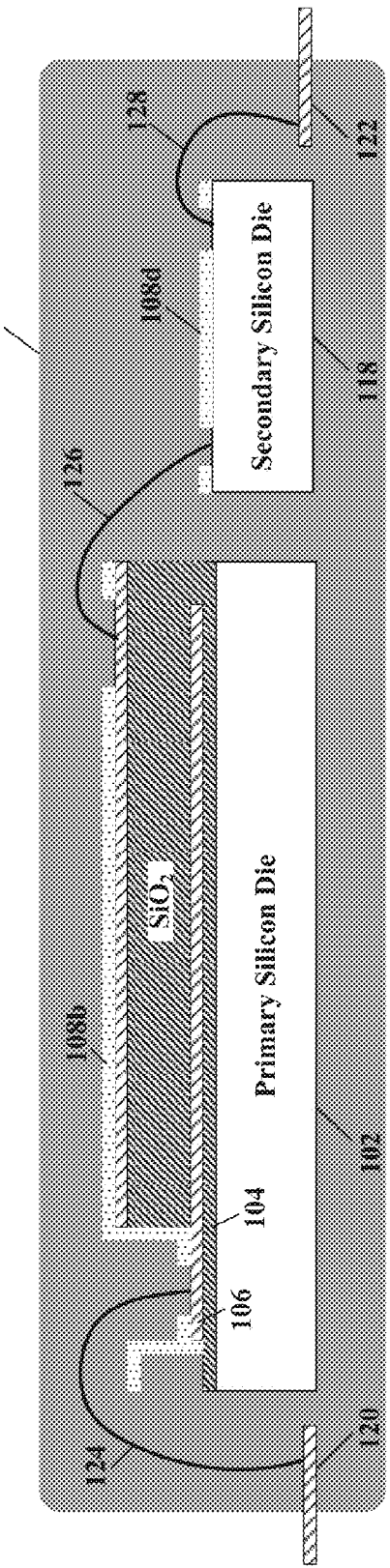

Referring to FIGS. 1 and 1A, depicted are schematic elevational view diagrams of a high voltage rated isolation capacitor formed on an integrated circuit, according to a specific example embodiment of this disclosure. A high voltage rated isolation capacitor, generally represented by the numeral 100, may comprise a first conductive layer 106, a second conductive layer 112, a high voltage rated dielectric (insulating) layer 110 between the first and second conductive layers 106 and 112, respectively, and an insulating layer 108, e.g., passivation, over the second conductive layer 112 and a portion of the first conductive layer 106. A first pad opening 114 may be used to provide electrical access to the first conductive layer 106. A second pad opening 116 may be used to provide electrical access to the second conductive layer 112. The high voltage rated isolation capacitor 100 may be positioned over and attached to an insulating layer 104 deposed on an integrated circuit 102.

At least one high voltage rated isolation capacitor 100 may be fabricated using a first mask to form the first conductive layer 106, and a second mask to form the second conductive layer 112 and the high voltage rated dielectric layer 110. A third mask may be used to form first and second pad openings 114 and 116, respectively, in the insulating (e.g., passivation) layer 108. It is contemplated and within the scope of this disclosure that other process fabrications steps may be used with equal success, and one having ordinary skill in the art of integrated circuit fabrication and the benefit of this disclosure could come up with such alternate designs and still be within the spirit and intent of this disclosure.

The first and second conductive layers 106 and 112, respectively, may comprise a conductive metallic material such as, for example but is not limited to, aluminum, copper, titanium, tantalum, cobalt, molybdenum, silicides and salicides thereof, etc. The insulating layer 104 may be, for example but is not limited to, silicon dioxide ($SiO_2$), silicon nitride (SiN), Oxynitride, or stacked layers of doped or undoped oxides of different thicknesses and deposited or grown by standard techniques, etc. The high voltage rated dielectric layer 110 may be, for example but is not limited to, silicon dioxide ($SiO_2$), silicon nitride (SiN), $SiO_xN_y$, oxide-nitride-oxide (ONO), etc. The thickness of the insulating dielectric layer 110 may determine the voltage withstand capabilities of the high voltage rated isolation capacitor 100, and may be, for example but is not limited to, about four (4) microns thick $SiO_2$ for about a 3,000 volt DC insulation breakdown voltage. The insulating layer 108 may be a protective passivation layer, e.g., silicon dioxide, silicon nitride, etc., having openings for connection to the low voltage pad 114 and the high voltage pad 116. The terms "high voltage pad" and "low voltage pad" refer to different voltage domains that have no direct current (DC) connections for either power, ground or signals. The voltage differences may be large or small between voltage domains, and further may be used for protection from and isolation of devices subject to large voltage transients, e.g., sensors subject to induced electromotive force (EMF) volts that may be caused by lightning, power switching transients, etc.

Referring now to FIG. 1A, the first conductive layer 106 of the high voltage rated isolation capacitor 100 assembly may be connected to lead fingers 120 and/or connection pads on the integrated circuit 102, hereinafter "primary IC 102," with bond wires 124. The conductive layer 112 of the high voltage rated isolation capacitor 100 assembly may be connected to connection pads on a second integrated circuit 118, hereinafter "secondary IC 118," and/or lead fingers 122 with bond wires 126. The secondary IC 118 may be connected to the lead fingers 122 with bond wires 128. The primary IC 102 may be configured to operate in a first voltage domain, and the secondary IC 118 may be configured to operate in a second voltage domain. The ground and voltage potentials between the first and second voltage domains may be thousands of volts different, only limited by the voltage withstand (breakdown) of the high voltage rated dielectric layer 110, e.g., thickness thereof. The lead fingers 120 may be coupled to the first voltage domain, and the lead fingers 122 may be coupled to the second voltage domain. The primary IC 102, the high voltage rated isolation capacitor 100, secondary IC 118, and portions of the lead fingers 120 and 122 may be encapsulated in an integrated circuit package 130, e.g., epoxy. Die paddles, if used, are not shown for illustrative clarity. It is contemplated and within the scope of this disclosure that other integrated circuit external connection nodes besides lead fingers may be used, e.g., ball bumps, etc.

Figure 1B:
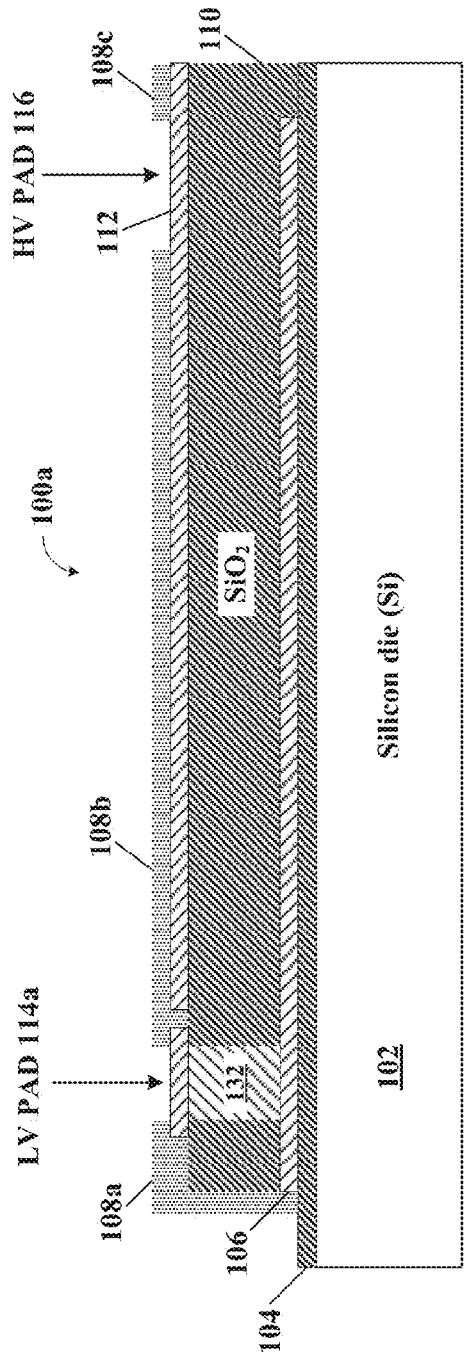
FIGS. 1B and 1C illustrate schematic elevational view diagrams of a high voltage rated isolation capacitor formed on an integrated circuit, according to another specific example embodiment of this disclosure.
Figure 1C:
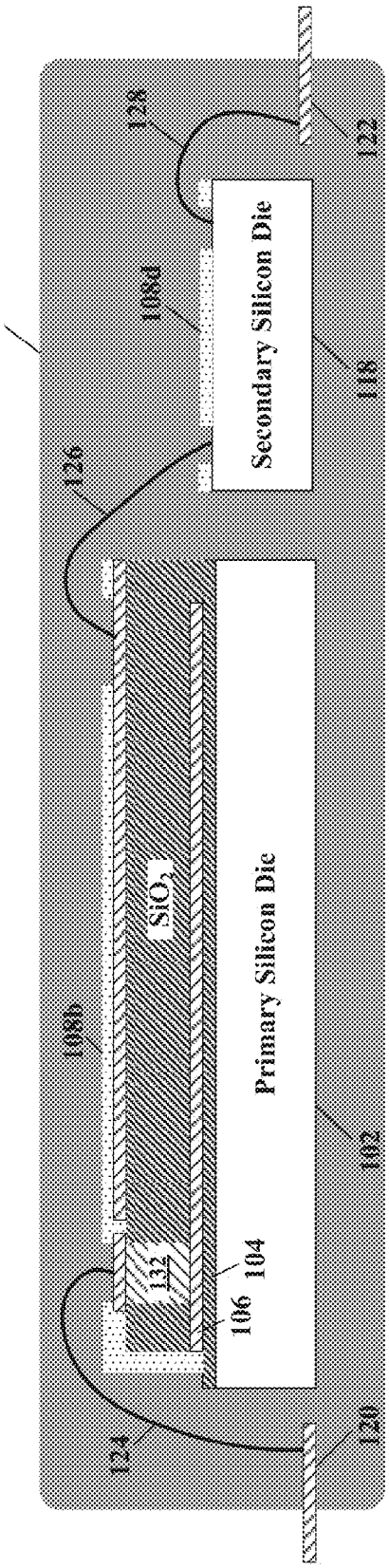

Referring to FIGS. 1B and 1C, depicted are schematic elevational view diagrams of a high voltage rated isolation capacitor formed on an integrated circuit, according to another specific example embodiment of this disclosure. A high voltage rated isolation capacitor, generally represented by the numeral 100a, may comprise a first conductive layer 106, a second conductive layer 112, a high voltage rated dielectric (insulating) layer 110 between the first and second conductive layers 106 and 112, respectively, and an insulating layer 108, e.g., passivation, over the second conductive layer 112 and a portion of the first conductive layer 106. Conductive material 132 may be used to fill in an opening in the high voltage rated dielectric layer 110 that may be over the first conductive layer 106. The conductive material 132 may be used to provide electrical access to the first conductive layer 106. A second pad opening 116 may be used to provide electrical access to the second conductive layer 112. The high voltage rated isolation capacitor 100a may be positioned over and attached to an insulating layer 104 deposed on an integrated circuit 102. Operation of the high voltage rated isolation capacitor 100a is substantially the same as operation of the high voltage rated isolation capacitor 100 described hereinabove.

Figure 2:
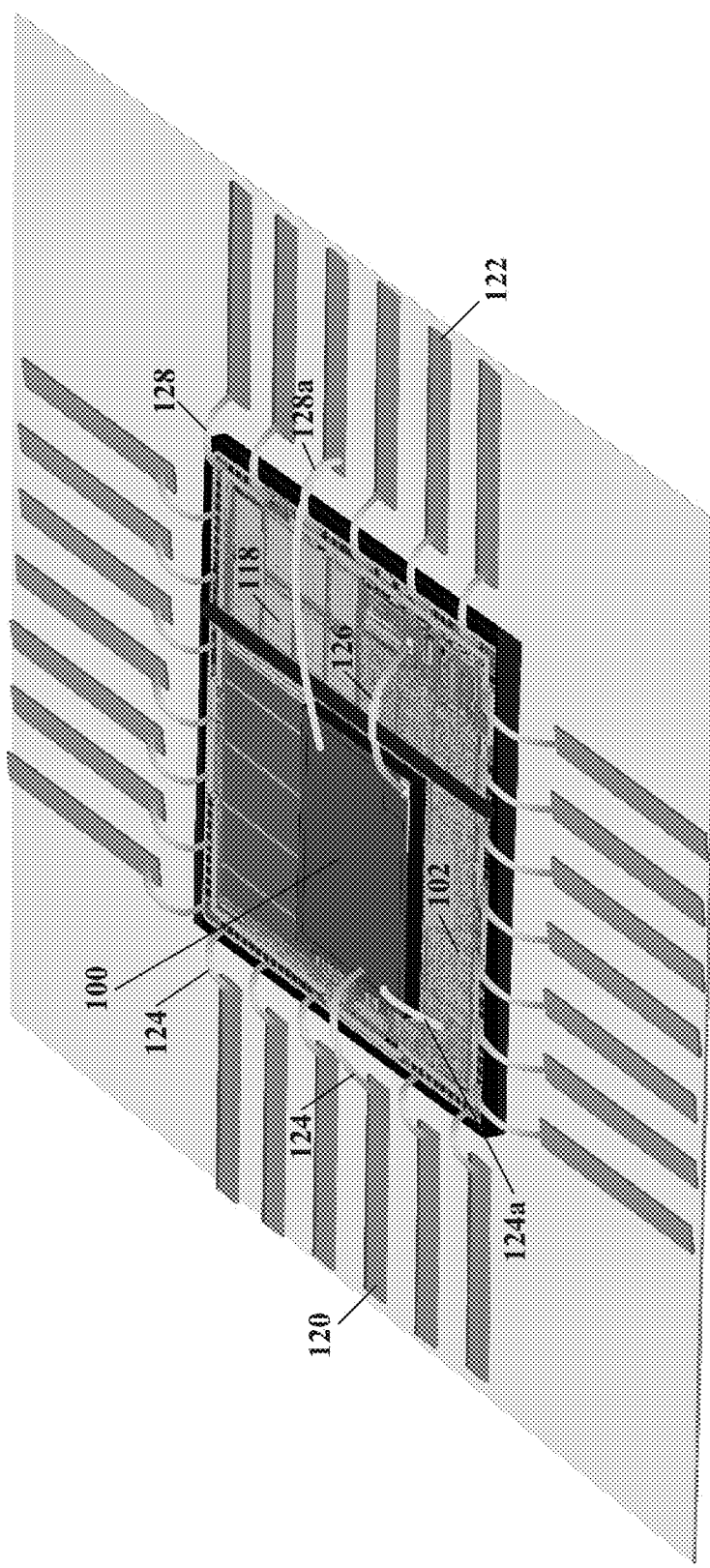
FIG. 2 illustrates a schematic orthogonal view diagram of a high voltage rated isolation capacitor formed on an integrated circuit, according to specific example embodiments of this disclosure.

Referring to FIG. 2, depicted is a schematic orthogonal view diagram of a high voltage rated isolation capacitor formed on an integrated circuit, according to specific example embodiments of this disclosure. The high voltage rated isolation capacitor 100 is shown attached to the primary IC 102 and connected to some of the lead fingers 120 with bond wires 124, the primary IC 102 with bond wires 124a, the secondary IC 118 with bond wires 126, and/or the lead fingers 122 with bond wires 126a. The high voltage rated isolation capacitor 100 may be attached to an insulating layer 104, e.g., passivation layer, on a face of the primary IC 102.

Figure 3:
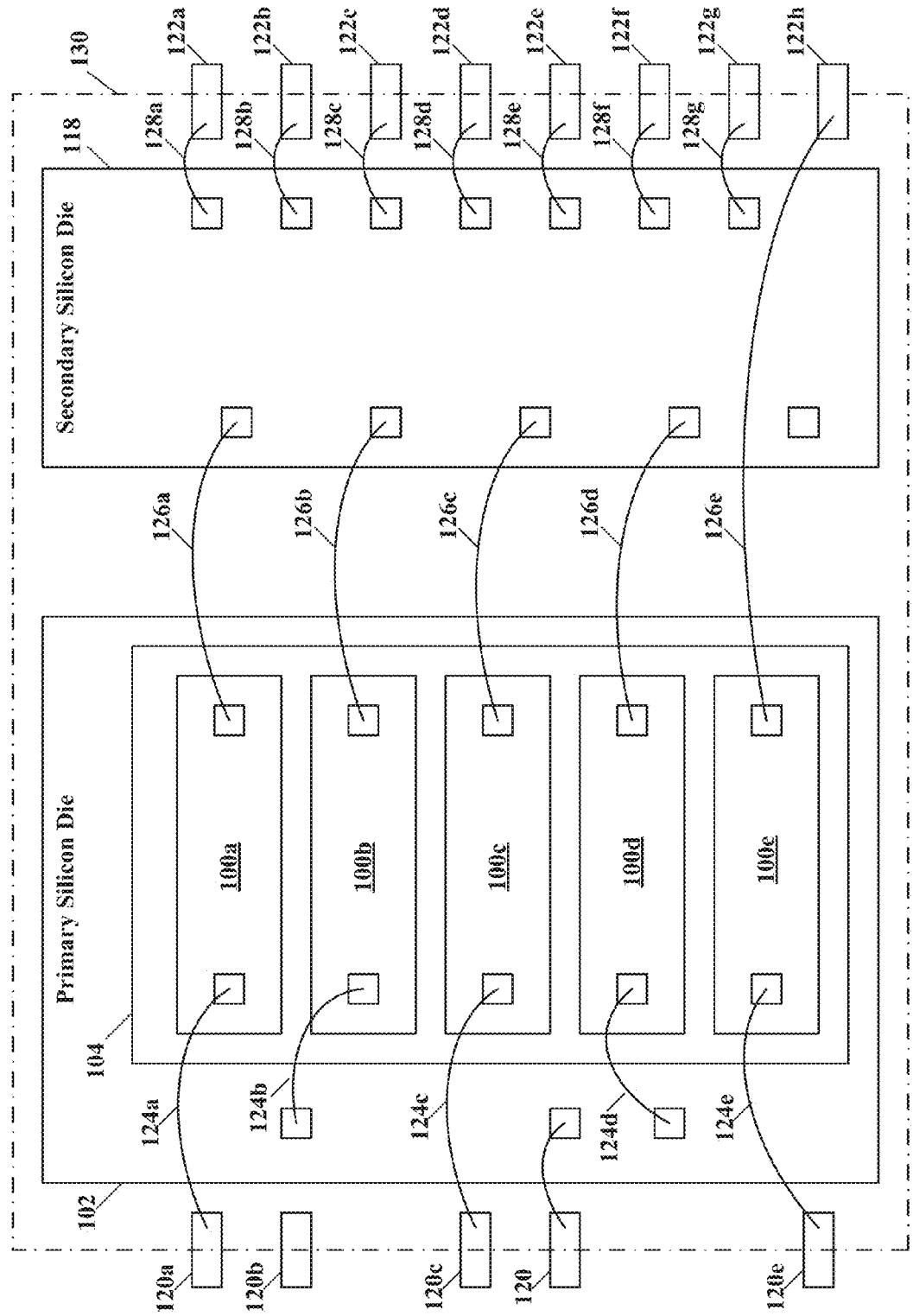
FIG. 3 illustrates a schematic plan view diagram of a plurality of high voltage rated isolation capacitors formed on a primary integrated circuit and coupled to a secondary integrated circuit, according to specific example embodiments of this disclosure.

Referring to FIG. 3, depicted is a schematic plan view diagram of a plurality of high voltage rated isolation capacitors formed on a primary integrated circuit and coupled to a secondary integrated circuit, according to specific example embodiments of this disclosure. A plurality of high voltage rated isolation capacitors 100 may be deposed over the primary IC 102 on an insulating layer 104 (FIGS. 1 and 1A). Each of the plurality of high voltage rated isolation capacitors 100 may be used to direct current (DC) isolate a lead finger 120 in a first voltage domain from a signal or power pad of the secondary IC 118 in a second voltage domain (e.g., lead finger 120a, bond wire 124a, isolation capacitor 100a, bond wire 126a and connection pad of secondary IC 118). From a signal pad of the primary IC 102 to a signal pad of the secondary IC 118 (e.g., bond wire 124b, isolation capacitor 100b, bond wire 126b and connection pad of secondary IC 118). From a lead finger 120e in the first voltage domain to a lead finger 122h in the second voltage (e.g., bond wire 124e, isolation capacitor 100e, bond wire 126e and lead finger 122h).

A plurality of high voltage rated isolation capacitors 100 may be connected as necessary for a particular application. Each of the high voltage rated isolation capacitors 100 may be formed as shown in FIGS. 1 and 1A and described hereinabove. It is contemplated and with the scope of this disclosure that the high voltage rated isolation capacitors 100 may be formed in any geometric shape desired and they are not limited to square or rectangular shapes as shown in the specific example embodiment shown in FIG. 3.

Figure 4:
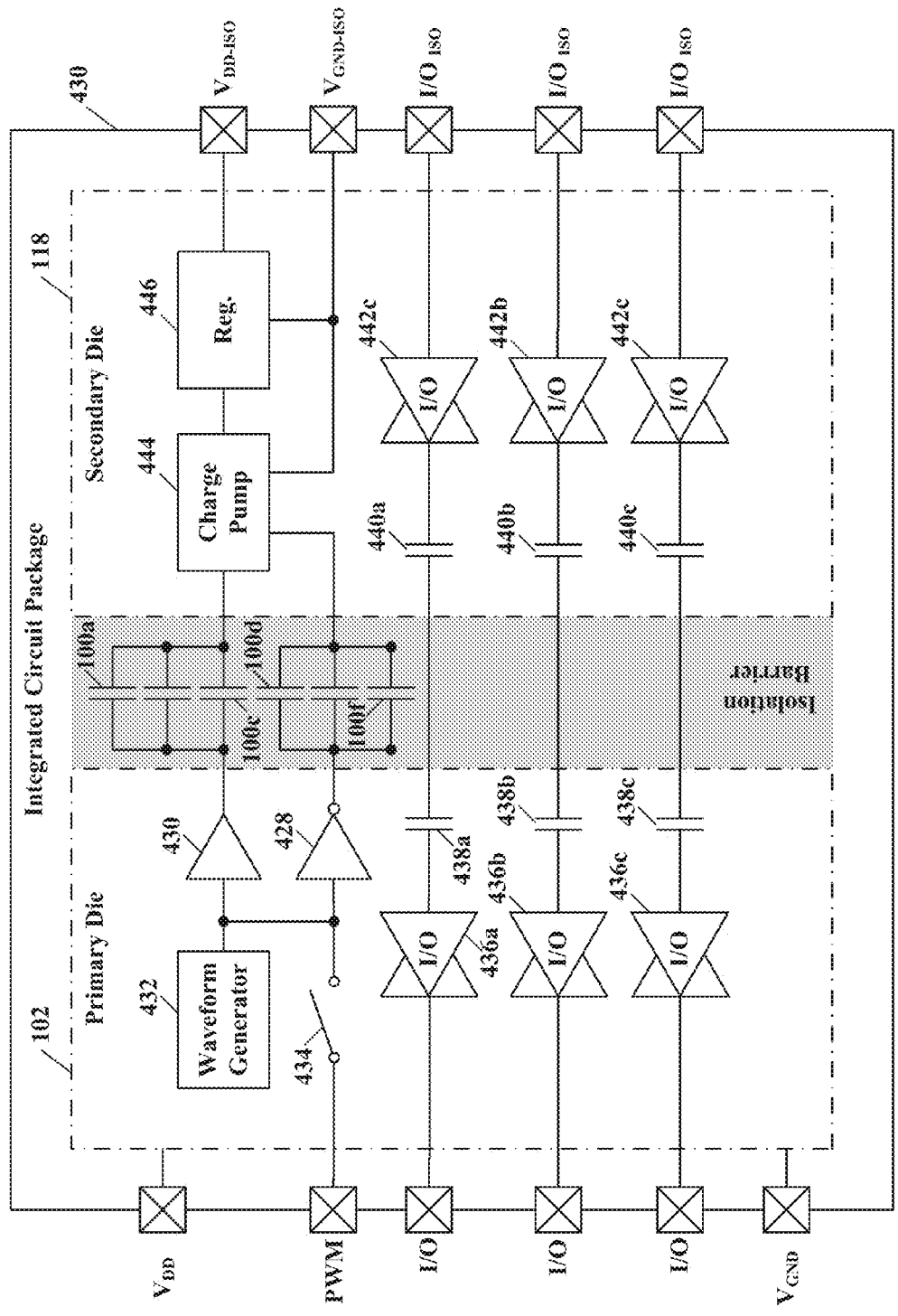
FIG. 4 illustrates a schematic block diagram of a plurality of high voltage rated isolation capacitors coupling power and signal circuits between a primary integrated circuit and a secondary integrated circuit, according to specific example embodiments of this disclosure.

Referring to FIG. 4, depicted is a schematic block diagram of a plurality of high voltage rated isolation capacitors coupling power and signal circuits between a primary integrated circuit and a secondary integrated circuit, according to specific example embodiments of this disclosure. Power may be isolated and transferred from the first voltage domain to the second voltage domain, or visa-versa, using an alternating current (AC) voltage through a plurality of high voltage rated isolation capacitors 100, e.g., isolation capacitors 100a-100f. This AC voltage may be generated by a waveform generator 432, e.g., oscillator, power switches controlled by pulse width modulation (PWM) modulator, etc., or an external pulse width modulation (PWM) signal when a switch 434 is closed and the waveform generator 432 is inactive. Drivers 430 and 428 may provide a push-pull (e.g., differential signal) waveform not requiring a ground reference through the isolation capacitors 100a-100f to a voltage charge pump 444 that may then provide an isolated voltage to a voltage regulator 446 in the second voltage domain. Programmable input/output (I/O) 436 in the first voltage domain and programmable input/output (I/O) 442 in the second voltage domain may be provided and DC isolated with smaller series connected capacitors 438 and 440 (increased voltage withstand) or by additional isolation capacitors 100.

Figure 6:
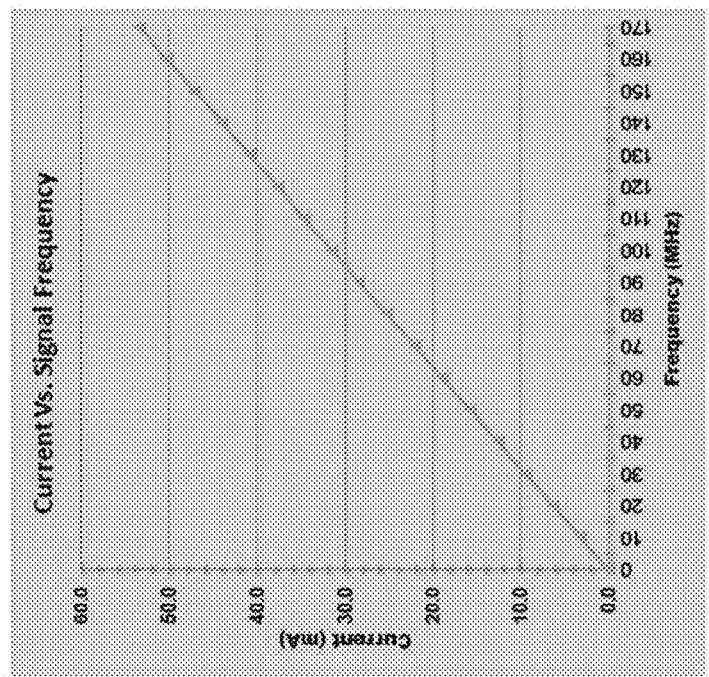
FIG. 6 illustrates a table and a graph of the current carrying capabilities of a 10 picofarad (pF) capacitor versus signal frequency applied thereto, according to the teachings of this disclosure.

Referring to FIG. 6, depicted are a table and a graph of the current carrying capabilities of a 10 picofarad (pF) capacitor versus signal frequency applied thereto, according to the teachings of this disclosure. The isolation capacitors 100 may preferably have a capacitance value of about 10 picofarads. The table and graph shown in FIG. 6 provide current carrying capabilities at different frequencies for a 10 pF capacitor. When one 10 pF capacitor cannot supply a sufficient amount of current at a desired frequency then adding additional parallel connected isolation capacitors 100 may be appropriate, e.g., see FIG. 4, isolation capacitors 100a-100f.

Referring back to FIG. 4, low level signals from signal output drivers to signal input drivers may have much lower signal current requirements, e.g., higher impedances. Therefore, small value capacitors may be effectively used, e.g., about one (1) pF. Capacitors 438 and 440 may be of the same construction as the isolation capacitors 100, or constructions know in the integrated circuit fabrication arts. Any capacitor blocks DC so preferably signal data transfers between circuits in the first and second voltage domains will be edge triggered with latches or registers for long term data logic level retention. These isolation capacitors 100 may also be used for power supply applications in microcontrollers and other analog products and are not limited only to isolation devices.

Figure 5:
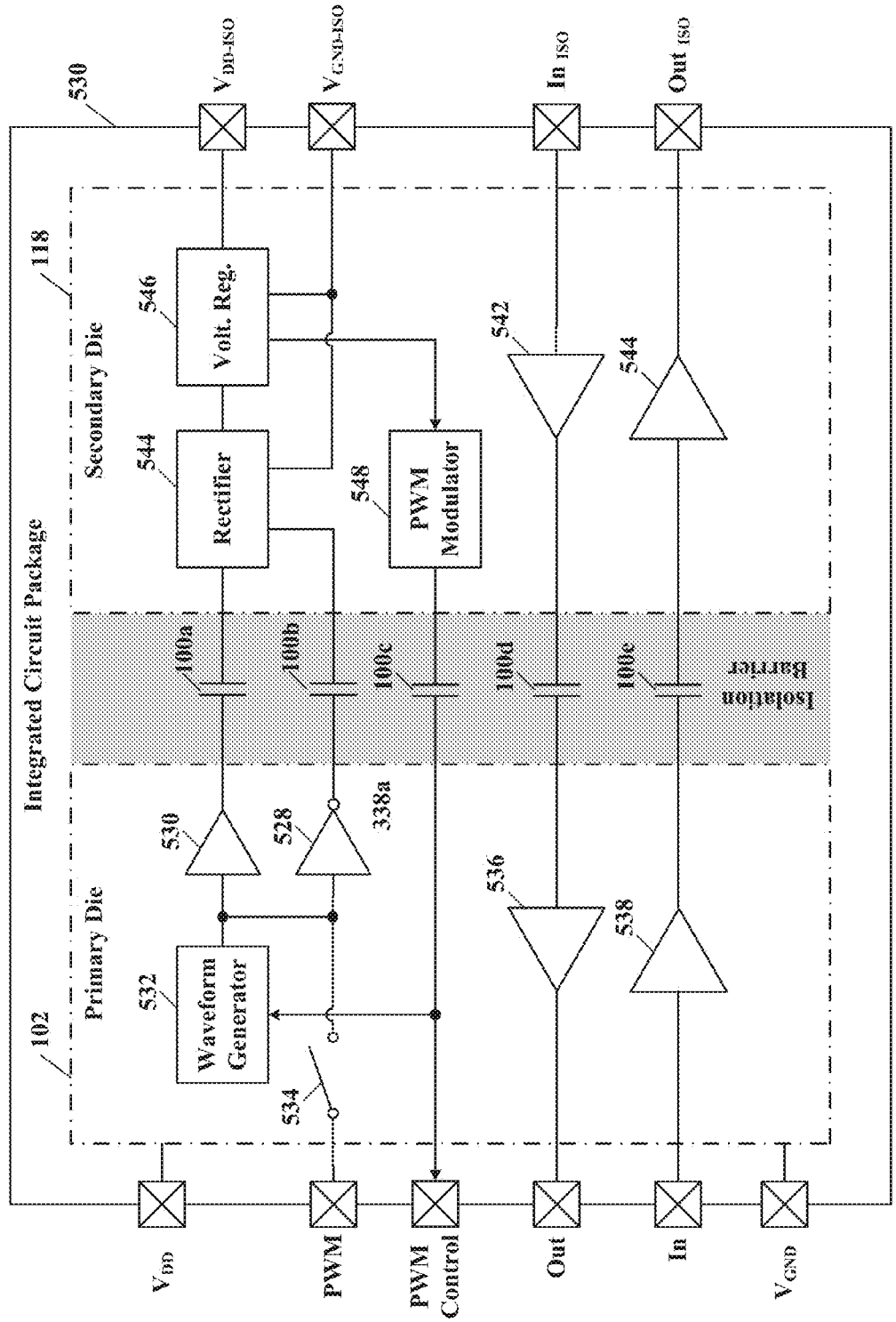
FIG. 5 illustrates a schematic block diagram of a plurality of high voltage rated isolation capacitors coupling power and signal circuits between a primary integrated circuit and a secondary integrated circuit wherein the circuits of the secondary integrated circuit control power transfer from the primary integrated circuit to the secondary integrated circuit, according to another specific example embodiment of this disclosure.

Referring to FIG. 5, depicted is a schematic block diagram of a plurality of high voltage rated isolation capacitors coupling power and signal circuits between a primary integrated circuit and a secondary integrated circuit wherein the circuits of the secondary integrated circuit control power transfer from the primary integrated circuit to the secondary integrated circuit, according to another specific example embodiment of this disclosure. Power may be isolated and transferred from the first voltage domain to the second voltage domain, or visa-versa, using an alternating current (AC) voltage through high voltage rated isolation capacitors 100, e.g., isolation capacitors 100a and 100b. This AC voltage may be generated by a waveform generator 532, e.g., oscillator, power switches controlled by pulse width modulation (PWM) modulator, etc., or an external pulse width modulation (PWM) signal when a switch 534 is closed and the waveform generator 532 is inactive. The waveform generator 532 provides an AC voltage to drivers 530 and 528, and drivers 530 and 528 may provide a push-pull (e.g., differential signal) waveform not requiring a ground reference through the isolation capacitors 100a and 100b to a rectifier 544 in the second voltage domain.

The rectifier 544 provides a DC voltage to a voltage regulator 546 that provides a power source voltage in the second voltage domain. The voltage regulator 546 may also provide an error voltage between an internal voltage reference (not shown) and the isolated voltage $V_{DD\text{-}ISO}$ so to a PWM modulator 548. The output of the PWM modulator 548 provides a feedback control signal through isolation capacitor 100c to the waveform generator 532 or an external PWM generator (not shown). From this feedback control signal the waveform generator 532 may vary its output amplitude and/or frequency to maintain a desired isolated voltage $V_{DD\text{-}ISO}$, e.g., for the secondary IC 118. Thus an isolated, highly efficient, regulated voltage may be provided from the first voltage domain to the second voltage domain. Isolated inputs from the first voltage domain may be received, for example, by an input circuit 538 and isolation coupled through the isolation capacitor 100e to an output driver circuit 544 to the second voltage domain. Similarly, isolated inputs from the second voltage domain may be received, for example, by an input circuit 542 and isolation coupled through the isolation capacitor 100d to an output driver circuit 536 to the first voltage domain.

It should be noted that the supply voltage ($V_{DD}$) in the first voltage domain is transferred as AC energy using an internal waveform generator 532, and transferred to the second voltage domain side across the isolation barrier through the isolation capacitors 100a and 100b. The DC supply voltage ($V_{DD\text{-}ISO}$) may be developed from the rectified AC signal from the isolation capacitors 100a and 100b, and regulated through a feedback circuit that is formed by the PWM modulator 548 and feedback isolation coupling capacitor 100c.

The waveform generator 532 may also be a PWM generator controlled by the PWM modulator 548. It is contemplated and within the scope of this disclosure that an external PWM generator (not shown) may be used and controlled by the PWM modulator 548.

Figures 7, 7A:
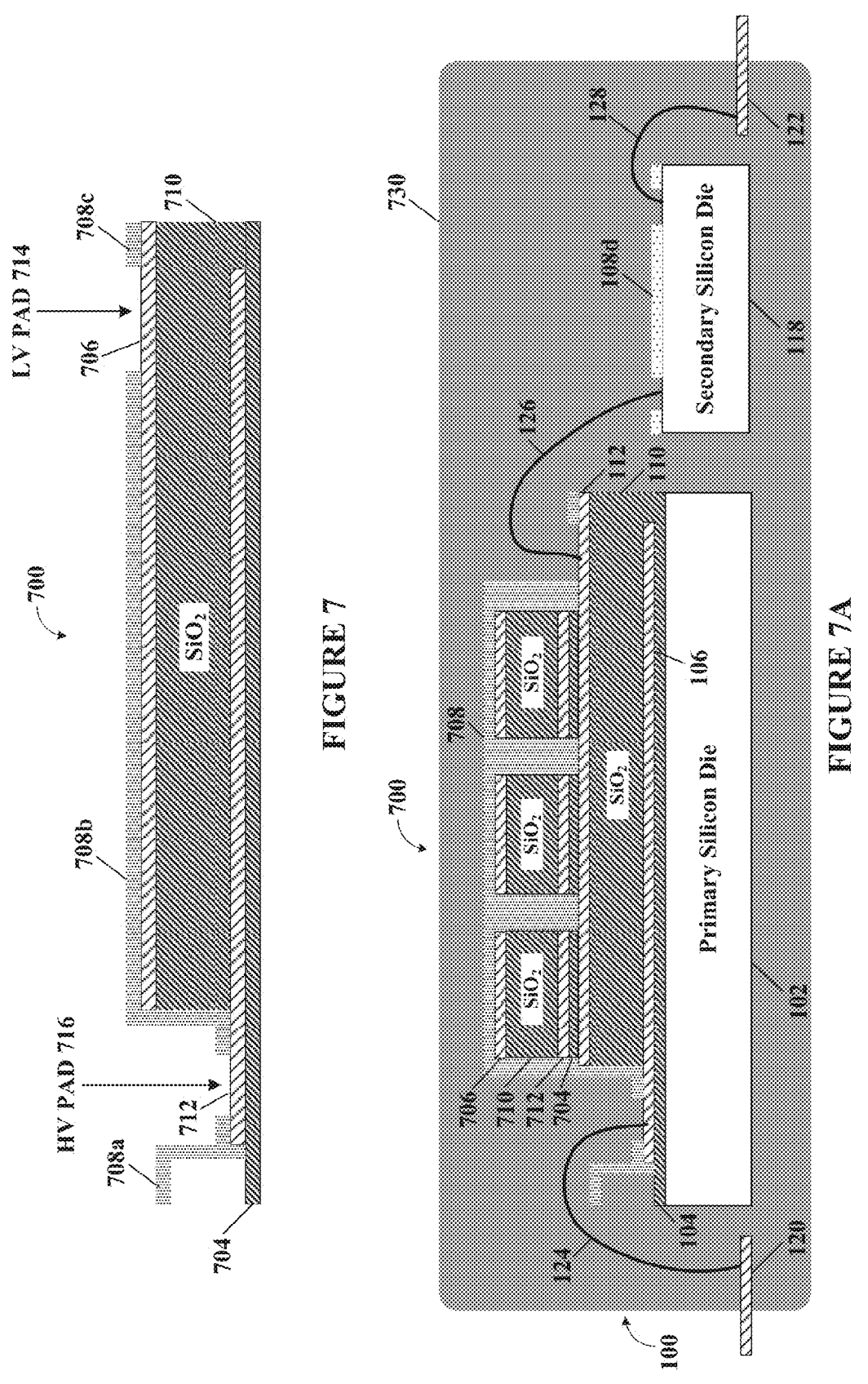

Referring to FIGS. 7 and 7A, depicted are schematic elevational view diagrams of a plurality of inverse stacked high voltage rated isolation capacitors formed on an integrated circuit, according to another specific example embodiment of this disclosure. Another high voltage rated isolation capacitor, generally represented by the numeral 700, may comprise an insulating layer 704 over the second electrically conductive layer 112, a third conductive layer 712 over the insulating layer 704, an insulating dielectric layer 710 over a portion of the third conductive layer 712, a fourth conductive layer 706 over the insulating dielectric layer 710, and an insulating layer 708 over the fourth conductive layer 706 and a portion of the third conductive layer 712. A third pad opening 716 in the insulating layer 708 may provide electrical connection access to the third conductive layer 712. A fourth pad opening 714 in the insulating layer 708 may provide electrical connection access to the fourth conductive layer 706, The high voltage rated isolation capacitor(s) 700 may be positioned over and attached to the high voltage rated isolation capacitor(s) 100 deposed on the primary IC 102. Construction of the high voltage rated isolation capacitor(s) 700 may be substantially the same as the high voltage rated isolation capacitor(s) 100 except that the third and fourth conductive layers 712 and 706, respectively, may be inverted so that a less thick electrical insulation (e.g., electrical insulating layer 704) has to be placed between the isolation capacitors 100 and 700 in order to maintain a desired voltage break down rating between the first and second voltage domains. The primary and secondary ICs 102 and 118, and the isolation capacitors 100 and 700 may be encapsulated (packaged) in an integrated circuit package 730.

Figure 8:
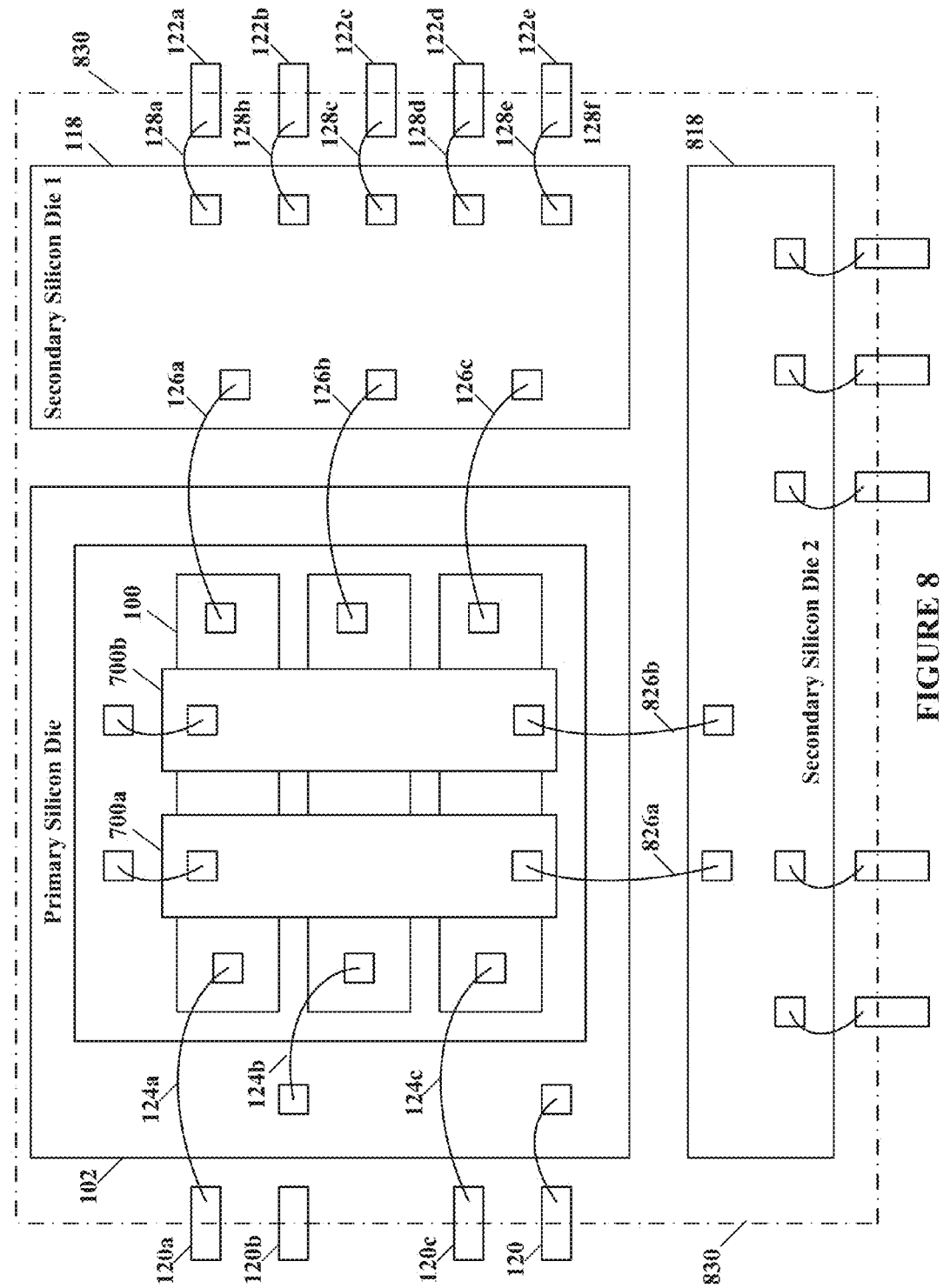
FIG. 8 illustrates a schematic plan view diagram of a plurality of high voltage rated isolation capacitors formed on a primary integrated circuit and coupled to first and second secondary integrated circuit, according to another specific example embodiment of this disclosure.

Referring to FIG. 8, depicted is a schematic plan view diagram of a plurality of high voltage rated isolation capacitors formed on a primary integrated circuit and coupled to first and second secondary integrated circuit, according to another specific example embodiment of this disclosure. The isolation capacitors 100 and 700 may be placed perpendicular to each other and another secondary IC 818 may be coupled to the isolation capacitors 700. This allows two or more secondary ICs to be packaged, e.g., IC package 830, with the primary IC 102. The secondary ICs 118 and 818 may both be in a second voltage domain, or the secondary IC 118 may be in the second voltage domain and the secondary IC 818 may be in the third voltage domain, wherein both secondary ICs 118 and 818 may be completely isolated from the primary IC 102 in the first voltage domain. In addition, the secondary ICs 118 and 818 may be isolated from each other when configured in second and third voltage domains. The primary IC 102 may comprise a microcontroller, etc., and the secondary ICs 118/818 may be digital signal processors (DSP), charge time measurement units (CTMU), co-processors, specialized input output interfaces, counters, timers, analog-to-digital converters (ADC), digital-to-analog converters (DAC), etc. The primary and secondary ICs 102, 118 and 818, and the isolation capacitors 100 and 700 may be encapsulated (packaged) in an integrated circuit package 830.

A plurality of high voltage rated isolation capacitors 100 and 700 may be connected as necessary for a particular application. Each of the high voltage rated isolation capacitors 100 and 700 may be formed as shown in FIGS. 7 and 7A and described hereinabove. It is contemplated and with the scope of this disclosure that the high voltage rated isolation capacitors 100 and 700 may be formed in any geometric shape desired and they are not limited to square or rectangular shapes as shown in the specific example embodiment shown in FIGS. 3 and 8.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

What is claimed is:

1. An integrated circuit device adapted to have voltage isolation between different voltage domains, comprising:
   a primary integrated circuit;
   a first insulating layer on at least a portion of a face of the primary integrated circuit;
   a first electrically conductive layer on the first insulating layer, wherein the first insulating layer entirely insulates the first electrically conductive layer, wherein the first electrically conductive layer is configured to be coupled via a bond wire to a leadframe finger connection or a circuit connection pad on the primary integrated circuit;
   a high voltage rated dielectric layer on a portion of the first electrically conductive layer; and
   a second electrically conductive layer on the high voltage rated dielectric layer, wherein the second electrically conductive layer comprises a contact pad area which is electrically insulated from the primary integrated circuit, wherein the first and second electrically conductive layers and the high voltage rated dielectric layer form a high voltage rated isolation capacitor.

2. The integrated circuit device according to claim 1, further comprising a secondary integrated circuit having a circuit connection pad coupled to the second electrically conductive layer via a bond wire, wherein the primary integrated circuit is in a first voltage domain and the secondary integrated circuit is in a second voltage domain.

3. The integrated circuit device according to claim 2, further comprising a second insulating layer over at least a portion of the second electrically conductive layer, and over portions of the high voltage rated dielectric layer and the first electrically conductive layer, wherein the second insulating layer has
   a first opening over the first electrically conductive layer for a first bond wire to couple the first electrically conductive layer to the circuit connection pad on the primary integrated circuit, and
   a second opening over the second electrically conductive layer for a second bond wire to couple the second electrically conductive layer to the circuit connection pad on the secondary integrated circuit.

4. The integrated circuit device according to claim 1, wherein the first and second electrically conductive layers are metal.

5. The integrated circuit device according to claim 1, wherein the high voltage rated dielectric layer comprises silicon dioxide ($SiO_2$).

6. The integrated circuit device according to claim 1, wherein the high voltage rated dielectric layer has a thickness of about four (4) microns (µ).

7. The integrated circuit device according to claim 1, wherein the high voltage rated isolation capacitor has a capacitance value of about 10 pF.

8. The integrated circuit device according to claim 1, wherein the primary integrated circuit comprises a microcontroller.

9. An integrated circuit device adapted to have voltage isolation between different voltage domains, comprising:
   a primary integrated circuit;
   a first insulating layer over at least a portion of a face of the primary integrated circuit;
   a plurality of first high voltage rated isolation capacitors over the first insulating layer, wherein each of the plurality of first high voltage rated isolation capacitors comprises
   a first electrically conductive layer on the first insulating layer, wherein the first insulating layer entirely insulates the first electrically conductive layer, wherein some of the first electrically conductive layers are configured to be coupled to respective circuit connection pads or leadframe finger connections on the primary integrated circuit;
   a first high voltage rated dielectric layer on a portion of a respective one of the plurality of first electrically conductive layers; and
   a second electrically conductive layer on the respective high voltage rated dielectric layer, wherein the second electrically conductive layer comprises at least one contact pad area which is electrically insulated from the primary integrated circuit.

10. The integrated circuit device according to claim 9, further comprising a second integrated circuit having circuit connection pads coupled to respective second electrically conductive layers, wherein the primary integrated circuit is in a first voltage domain and the second integrated circuit is in a second voltage domain.

11. An integrated circuit device adapted to have voltage isolation between different voltage domains, comprising:
   a primary integrated circuit die;
   a first insulating layer on at least a portion of a face of the primary integrated circuit die;

a first electrically conductive layer on the first insulating layer, wherein the first insulating layer entirely insulates the first electrically conductive layer, wherein the first electrically conductive layer is configured to be coupled via a bond wire to a leadframe finger connection or a circuit connection pad on the primary integrated circuit die;

a high voltage rated dielectric layer on a portion of the first electrically conductive layer;

a second electrically conductive layer on the high voltage rated dielectric layer, wherein the second electrically conductive layer comprises a contact pad area which is electrically insulated from the primary integrated circuit, wherein the first and second electrically conductive layers and the high voltage rated dielectric layer form a high voltage rated isolation capacitor; and a secondary integrated circuit die having a circuit connection pad coupled to the second electrically conductive layer, wherein the primary integrated circuit die is in a first voltage domain and the secondary integrated circuit die is in a second voltage domain.

12. The integrated circuit device according to claim 11, further comprising a second insulating layer over at least a portion of the second electrically conductive layer, and over portions of the high voltage rated dielectric layer and the first electrically conductive layer, wherein the second insulating layer has a first opening over the first electrically conductive layer for a first bond wire to couple the first electrically conductive layer to the circuit connection pad on the primary integrated circuit die, and a second opening over the second electrically conductive layer for a second bond wire to couple the second electrically conductive layer to the circuit connection pad on the secondary integrated circuit die.

13. The integrated circuit device according to claim 11, wherein the first and second electrically conductive layers are metal.

14. The integrated circuit device according to claim 11, wherein the high voltage rated dielectric layer comprises silicon dioxide ($SiO_2$).

15. The integrated circuit device according to claim 11, wherein the high voltage rated dielectric layer has a thickness of about four (4) microns ($\mu$).

16. The integrated circuit device according to claim 11, wherein the high voltage rated isolation capacitor has a capacitance value of about 10 pF.

17. The integrated circuit device according to claim 11, wherein the primary integrated circuit die comprises a microcontroller.

* * * * *